United States Patent
Park et al.

(10) Patent No.: US 10,665,276 B2
(45) Date of Patent: May 26, 2020

(54) SEMICONDUCTOR DEVICE

(71) Applicant: SK hynix Inc., Icheon-si, Gyeonggi-do (KR)

(72) Inventors: Gyu Tae Park, Icheon-si (KR); Young Suk Seo, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/220,283

(22) Filed: Dec. 14, 2018

(65) Prior Publication Data

US 2019/0348091 A1    Nov. 14, 2019

(30) Foreign Application Priority Data

May 8, 2018 (KR) .................. 10-2018-0052760

(51) Int. Cl.
*G11C 7/22* (2006.01)
*G11C 11/34* (2006.01)
*G11C 7/10* (2006.01)

(52) U.S. Cl.
CPC .............. *G11C 7/222* (2013.01); *G11C 7/109* (2013.01); *G11C 7/1057* (2013.01); *G11C 7/1063* (2013.01); *G11C 7/1084* (2013.01); *G11C 7/227* (2013.01); *G11C 11/34* (2013.01)

(58) Field of Classification Search
CPC ......... G11C 7/222; G11C 11/34; G11C 7/227; G11C 7/1063; G11C 7/1084; G11C 7/109; G11C 7/1057; G11C 2207/2272; G11C 7/1066
See application file for complete search history.

(56) References Cited

U.S. PATENT DOCUMENTS

2011/0116330 A1    5/2011 Kim et al.

FOREIGN PATENT DOCUMENTS

KR    101789077 B1    11/2017

*Primary Examiner* — Mohammed A Bashar
(74) *Attorney, Agent, or Firm* — William Park & Associates Ltd.

(57) ABSTRACT

A semiconductor device may include a first internal command generation circuit, a first DLL circuit, a second internal command generation circuit, and a second DLL circuit. The first internal command generation circuit may generate a first delay command in response to a first external command, a first latency, a first clock, a first delay control signal, and a second clock. The first DLL circuit may generate the first delay control signal and the first second clock in response to the first clock. The second internal command to generation circuit may generate a second delay command in response to a second external command, a second latency, the first clock, a second delay control signal, and a third clock. The second DLL circuit may generate the second delay control signal and the third clock in response to the first clock.

17 Claims, 5 Drawing Sheets

SEMICONDUCTOR DEVICE

CROSS-REFERENCES TO RELATED APPLICATION

The present application claims priority under 35 U.S.C. § 119(a) to Korean application number 10-2018-0052760, filed on May 8, 2018, in the Korean Intellectual Property Office, which is incorporated herein by reference in its entirety.

BACKGROUND

1. Technical Field

Various embodiments generally relate to a semiconductor integrated circuit, more particularly, to a semiconductor device.

2. Related Art

A semiconductor device may perform operations in accordance with external commands from an external device. The semiconductor device may output operated results to the external device.

In order to effectively transmit signals between the semiconductor device and the external device such as a controller or other semiconductor devices, predetermined rules of the signal transmission may be applied to the semiconductor device and the external device.

For example, when the commands are inputted into the semiconductor device from the external device, the semiconductor device may transmit results of the commands to the external device at a point of time in accordance with the predetermined rules. The predetermined rules in accordance with the operations may be referred to as latency.

SUMMARY

In accordance with examples of embodiments of the present disclosure, a semiconductor device may include a first internal command generation circuit, a first DLL circuit, a second internal command generation circuit, and a second DLL circuit. The first internal command generation circuit may generate a first delay command in response to a first external command, a first latency, a first clock, a first delay control signal, and a second clock. The first DLL circuit may generate the first delay control signal and the first second clock in response to the first clock. The second internal command generation circuit may generate a second delay command in response to a second external command, a second latency, the first clock, a second delay control signal, and a third clock. The second DLL circuit may generate the second delay control signal and the third clock in response to the first clock.

In accordance with examples of embodiments of the present disclosure, a semiconductor device may include a first internal command generation circuit, a first DLL circuit, a second internal command generation circuit, a second DLL circuit, a first path, and a second path. The first internal command generation circuit may delay a first external command by a delay time in accordance with a first latency and a first delay control signal to output a first delay command. The first DLL circuit may generate the first delay control signal. The second internal command generation circuit may delay a second external command by a delay time in accordance with a second latency and a second delay control signal to output a second delay command. The second DLL circuit may generate the second delay control signal. The first path may transmit the first delay command to a first internal circuit. The second path may transmit the second delay command to a second internal circuit.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present disclosure will be described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the inventive concept. Although a few embodiments of the present disclosure will be shown and described, it will be appreciated by those of ordinary skill in the art that changes may be made in these embodiments without departing from the principles and spirit of the present disclosure.

Examples of embodiments may provide a semiconductor device that may be capable of normally performing operations in accordance with commands from an external device.

According to examples of embodiments, the semiconductor device may output operated results in accordance with the external commands at a set timing.

A semiconductor device of examples of embodiments may operate an internal circuit at an accurate timing. For example, the semiconductor device may perform an on-die termination (ODT) operation and a read operation, etc.

Figure 1:
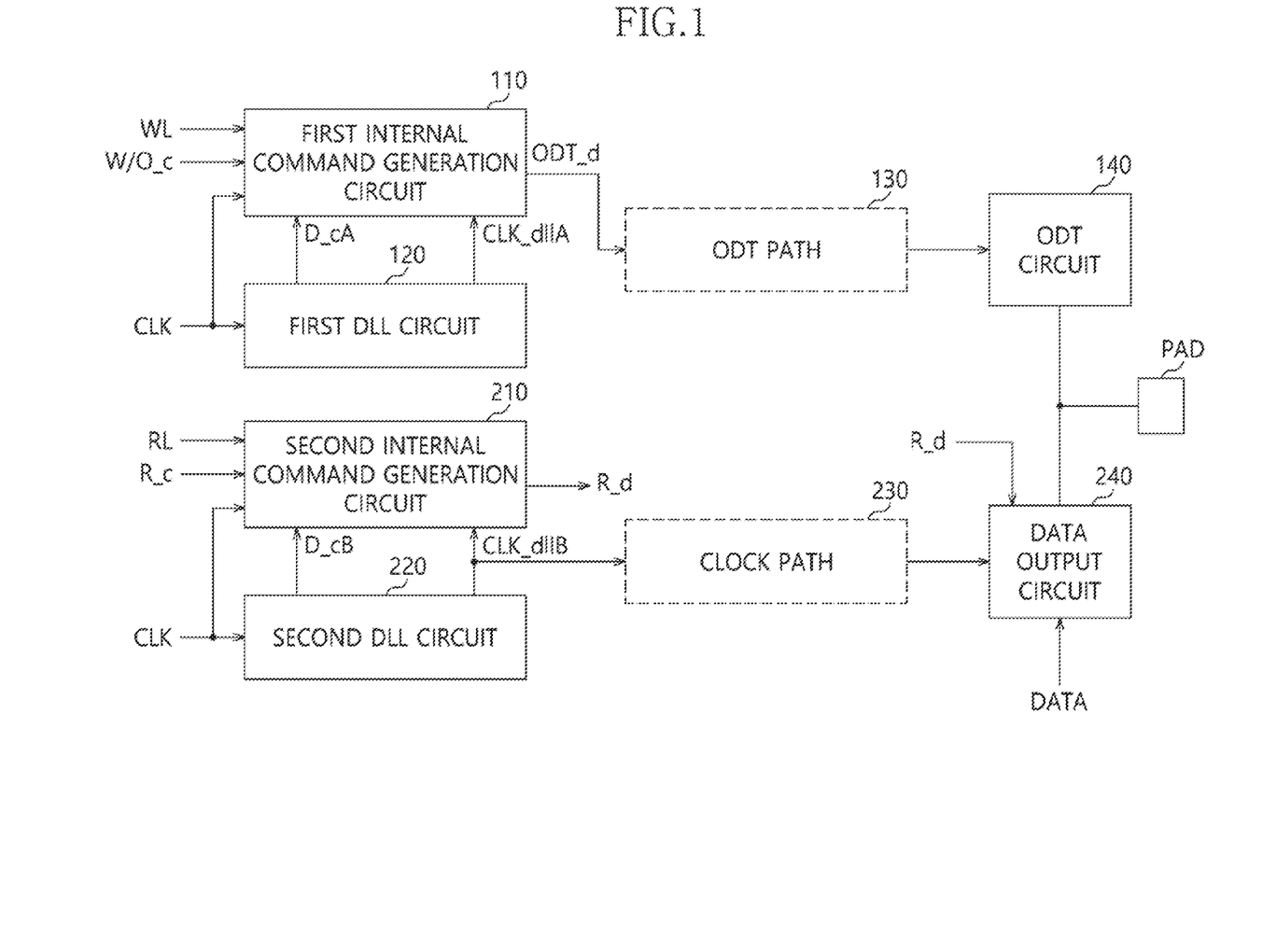
FIG. 1 is a block diagram illustrating a semiconductor device in accordance with examples of embodiments.

FIG. 1 is a block diagram illustrating a semiconductor device in accordance with examples of embodiments.

Referring to FIG. 1, the semiconductor device may include a first internal command generation circuit 110; a first DLL (delay-locked loop) circuit 120; an ODT path 130; a first internal circuit, for example, an ODT circuit 140; a second internal command generation circuit 210; a second DLL circuit 220; a clock path 230; and a second internal circuit, for example, a data output circuit 240.

The first internal command generation circuit 110 may generate a first delay command ODT_d in response to a first external command W/O_c, a first latency WL, a first clock CLK, a first delay control signal D_cA, and a second clock CLK_dllA. For example, the first internal command generation circuit 110 may synchronize the first external command W/O_c with the second clock CLK_dllA to output the first delay command ODT_d. The first internal command generation circuit 110 may determine an output timing of the first delay command ODT_d in accordance with the first latency WL and the first delay control signal D_cA.

The first DLL circuit 120 may generate the first delay control signal D_cA and the second clock CLK_dllA in response to the first clock CLK. For example, the first DLL circuit 120 may generate the second clock CLK_dllA having a phase advancing that of the first clock CLK by a delay time of the ODT path 130 (i.e., the first DLL circuit 120 may generate the second clock CLK_dllA having a phase earlier than the phase of the first clock CLK by a delay time of the ODT path 130). The first DLL circuit 120 may output the first delay control signal D_cA used for generating the second clock CLK_dllA from the first clock CLK.

The ODT path 130 may correspond to circuits through which the first delay command ODT_d may pass to reach the ODT circuit 140.

The ODT circuit 140 may perform a first internal operation, for example, the ODT operation when the first delay command ODT_d passing through the ODT path 130 is inputted into the ODT circuit 140. The ODT operation may correspond to an operation for matching internal impedance of the semiconductor device with external impedance. The ODT operation may remove noises generated by mismatching of the impedances when the semiconductor device outputs signals to an external device.

The second internal command generation circuit 210 may generate a second delay command R_d in response to a second external command R_c, a second latency RL, the first clock CLK, a second delay control signal D_cB, and a third clock CLK_dllB. For example, the second internal command generation circuit 210 may synchronize the second external command R_c with the third clock CLK_dllB to output the second delay command R_d. The second internal command generation circuit 210 may determine an output timing of the second delay command R_d in accordance with the second latency RL and the second delay control signal D_cB.

The second DLL circuit 220 may generate the second delay control signal D_cB and the third clock CLK_dllB in response to the first clock CLK. For example, the second DLL circuit 220 may generate the third clock CLK_dllB having a phase advancing that of the first clock CLK by a delay time of the clock path 230 (i.e., the second DLL circuit 220 may generate the third clock CLK_dllB having a phase earlier than the phase of the first clock CLK by a delay time of the clock path 230). The second DLL circuit 220 may output the second delay control signal D_cB used for generating the third clock CLK_dllB from the first clock CLK.

The clock path 230 may correspond to circuits through which the third clock CLK_dllB may pass to reach the data output circuit 240.

The data output circuit 240 may perform a second internal operation, for example, the data output operation when the second delay command R_d is inputted into the data output circuit 240. The data output operation may be an operation in which data DATA stored in the semiconductor device is output. The ODT circuit 140 and the data output circuit 240 may be connected to the same pad PAD. The pad PAD may function as to connect the internal circuit of the semiconductor device with the external device.

In examples of embodiments, the first latency WL may correspond to a write latency. The first external command W/O_c may correspond to a write command or an ODT command. The first clock CLK may correspond to an external clock. The second clock CLK_dllA may correspond to a DLL clock generated in accordance with the delay time of the ODT path 130. The third clock CLK_dllB may correspond to a DLL clock generated in accordance with the delay time of the clock path 230. The second external command R_c to may correspond to a data output command, i.e., a read command.

The second latency RL may correspond to a read latency. The delay time of the ODT path 130 and the delay time of the clock path 230 may be different from each other.

Figure 2:
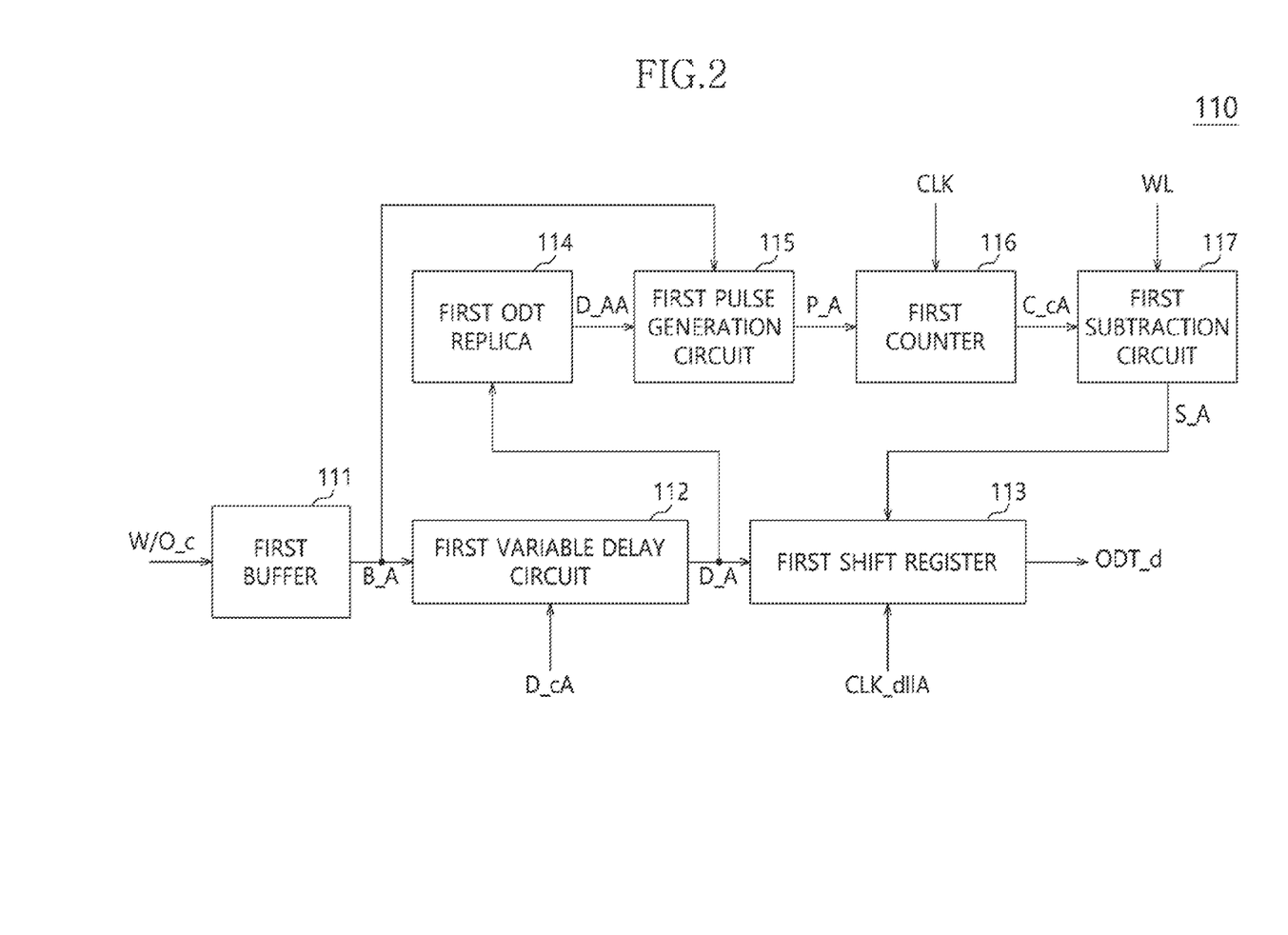
FIG. 2 is a block diagram illustrating a first internal command generation circuit of the semiconductor device in FIG. 1.

FIG. 2 is a block diagram illustrating a first internal is command generation circuit of the semiconductor device in FIG. 1.

Referring to FIG. 2, the first internal command generation circuit 110 may include a first buffer 111, a first variable delay circuit 112, a first shift register 113, a first ODT replica 114, a first pulse generation circuit 115, a first counter 116, and a first subtraction circuit 117.

The first buffer 111 may buffer the first external command W/O_c to output a first buffer signal B_A.

The first variable delay circuit 112 may delay the first buffer signal B_A by a delay time in accordance with the first delay control signal D_cA to output a first delay signal D_A.

The first shift register 113 may generate the first delay command ODT_d in response to the first delay signal D_A, a first subtraction signal S_A, and the second clock CLK_dllA. For example, the first shift register 113 may delay the first delay signal D_A by the delay time in accordance with the first subtraction signal S_A to output the first delay command ODT_d. The first shift register 113 may output the first delay command ODT_d in synchronization with the second clock CLK_dllA. Particularly, the first shift register 113 may delay the first delay signal D_A by a set period of the second clock CLK_dllA to output the first delay command ODT_d. The first shift register 113 may determine phase of the second clock CLK_dllA in response to the first subtraction signal S_A.

The first ODT replica 114 may delay the first delay signal D_A to output a second delay signal D_AA. A delay time of the first ODT replica 114 may correspond to the delay time of the ODT path 130 in FIG. 1. In an embodiment, a replica delay time of the first DLL circuit 120 (e.g. delay time of second ODT replica 124) may correspond to the delay time of the first ODT replica 114.

The first pulse generation circuit 115 may generate a first pulse P_A in response to the first buffer signal B_A and the second delay signal D_AA. For example, when the first buffer signal B_A is inputted into the first pulse generation circuit 115, the first pulse generation circuit 115 may enable the first pulse P_A. In contrast, when the second delay signal D_AA is inputted into the first pulse generation circuit 115, the first pulse generation circuit 115 may disable the first pulse P_A.

The first counter 116 may generate a first counting code C_cA in response to the first pulse P_A and the first clock CLK. For example, the first counter 116 may increase code values of the first counting code C_cA whenever the first clock CLK is transited into a specific level in an enabling section of the first pulse P_A.

The first subtraction circuit 117 may generate the first subtraction signal S_A in response to the first counting code C_cA and the first latency WL. For example, the first subtraction circuit 117 may subtract the code value of the first counting code C_cA from the value of the first latency WL to generate the first subtraction signal S_A.

Figure 3:
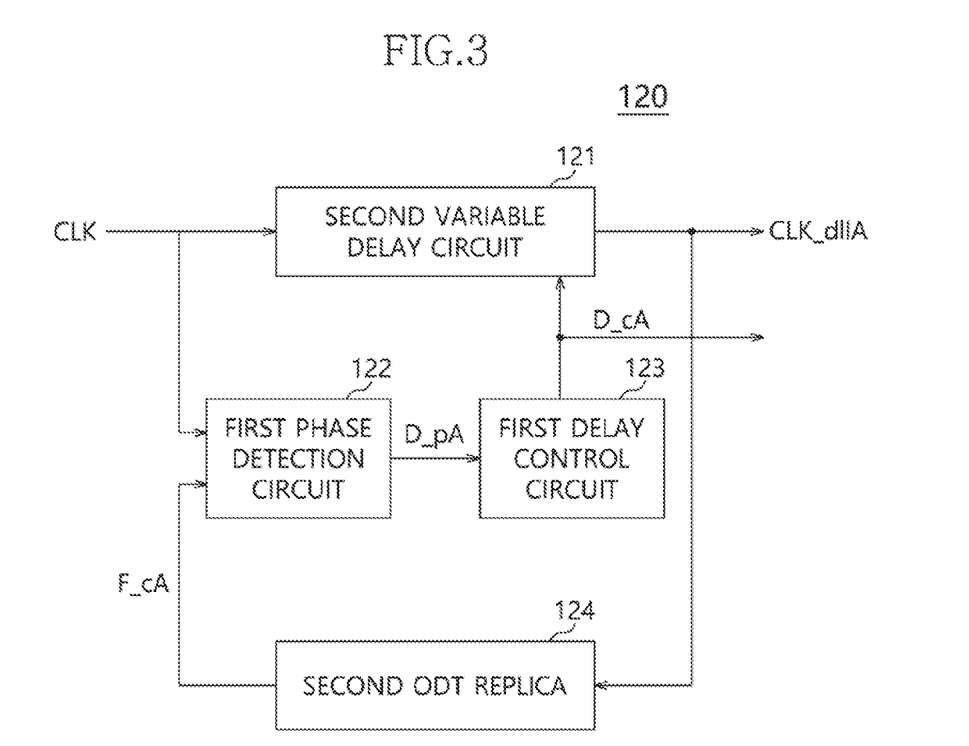
FIG. 3 is a block diagram illustrating a first DLL circuit of the semiconductor device in FIG. 1.

FIG. 3 is a block diagram illustrating a first DLL circuit of the semiconductor device in FIG. 1.

Referring to FIG. 3, the first DLL circuit 120 may include a second variable delay circuit 121, a first phase detection circuit 122, a first delay control circuit 123, and a second ©DT replica 124.

The second variable delay circuit 121 may delay the first clock CLK by a delay time in accordance with the first delay control signal D_cA to output the second clock CLK_dllA.

The first phase detection circuit 122 may compare phases of the first clock CLK and a first feedback clock F_cA with each other to generate a first phase detection signal D_pA.

The first delay control circuit 123 may generate the first delay control signal D_cA in response to the first phase detection signal D_pA.

The second ODT replica 124 may delay the second clock CLK_dllA to output the first feedback clock F_cA. A delay time of the second ODT replica 124 may correspond to the delay time of the ODT path 130 in FIG. 1. The delay time of the second ODT replica 124 may be substantially the same as that of the ODT path 130 in FIG. 1 and that of the first ODT replica 114 in FIG. 2. In an embodiment, a replica delay time of the first DLL circuit 120 may correspond to the delay time of the second ODT replica 124.

Figure 4:
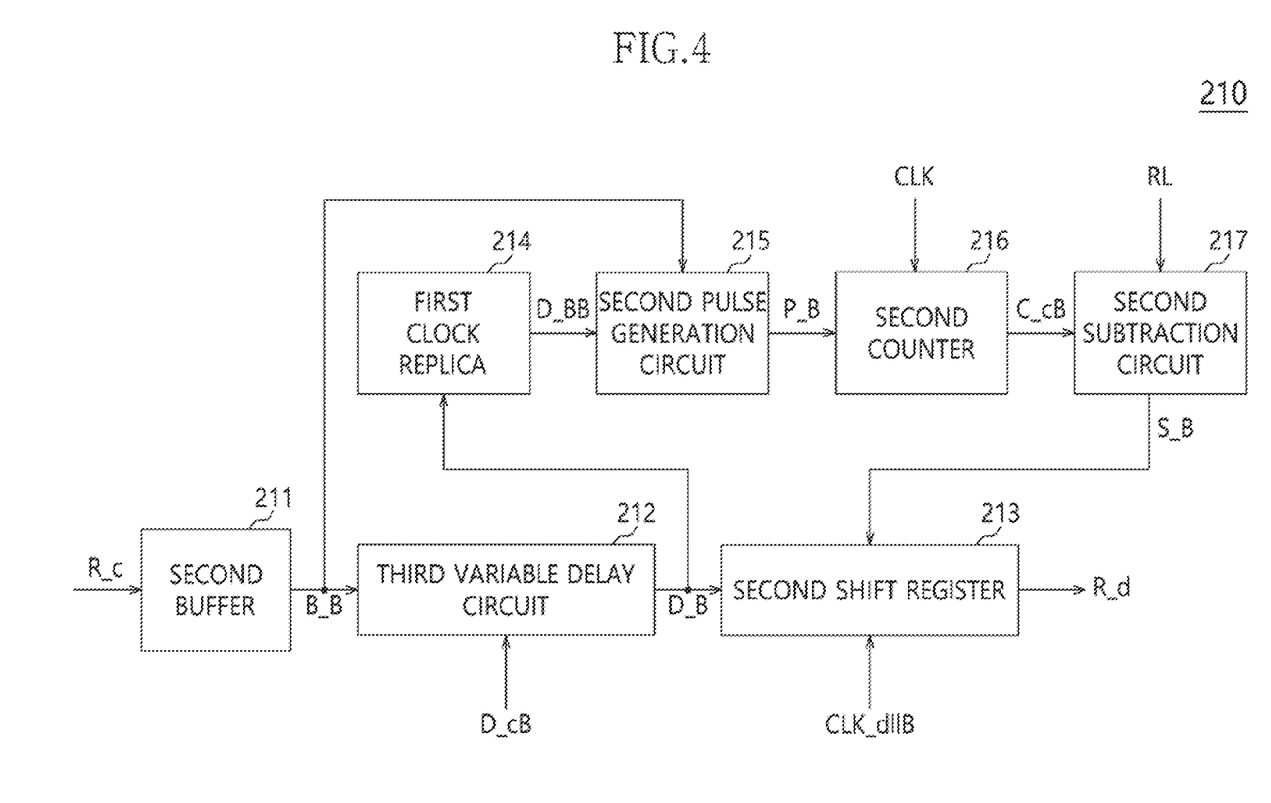
FIG. 4 is a block diagram illustrating a second internal command generation circuit of the semiconductor device in FIG. 1.

FIG. 4 is a block diagram illustrating a second internal command generation circuit of the semiconductor device in FIG. 1.

Referring to FIG. 4, the second internal command generation circuit 210 may include a second buffer 211, a third variable delay circuit 212, a second shift register 213, a first clock replica 214, a second pulse generation circuit 215, a second counter 216, and a second subtraction circuit 217.

The second buffer 211 may buffer the second external command R_c to output a second buffer signal B_B.

The third variable delay circuit 212 may delay the second buffer signal B_B by a delay time in accordance with the second delay control signal D_cB to output a third delay signal D_B.

The second shift register 213 may generate the second delay command R_d in response to the third delay signal D_B, a second subtraction signal S-B, and the third clock CLK_dllB. For example, the second shift register 213 may delay the third delay signal D_B by the delay time in accordance with the second subtraction signal S_B to output the second delay command R_d, The second shift register 213 may output the second delay command R_d in synchronization with the third clock CLK_dllB. Particularly, the second shift register 213 may delay the third delay signal D_B by a set period of the third clock CLK_dllB to output the second delay command R_d. The second shift register 213 may determine phase of the third clock CLK_dllB in response to the second subtraction signal S_B.

The first clock replica 214 may delay the third delay signal D_B to output a fourth delay signal D_BB. A delay time of the first clock replica 214 may correspond to the delay time of the clock path 230 in FIG. 1. In an embodiment, a replica delay time of the second DLL circuit 220 (e.g. delay time of second clock replica 224) may correspond to the delay time of the first clock replica 214, The second pulse generation circuit 215 may generate a second pulse P_B in response to the second buffer signal B_B and the fourth delay signal D_BB. For example, when the second buffer signal B_B is inputted into the second pulse generation circuit 215, the second pulse generation circuit 215 may enable the second pulse P_B. In contrast, when the fourth delay signal D_BB is inputted into the second pulse generation circuit 215, the second pulse generation circuit 215 may disable the second pulse P_B.

The second counter 216 may generate a second counting code C_cB in response to the second pulse P_B and the first clock CLK. For example, the second counter 216 may increase code values of the second counting code C_cB whenever the first clock CLK is transited into a specific level in an enabling section of the second pulse P_B.

The second subtraction circuit 217 may generate the second subtraction signal S_B in response to the second counting code C_cB and the second latency RL. For example, the second subtraction circuit 217 may subtract the code value of the second counting code C_cB from the value of the second latency RL to generate the second subtraction signal S_B.

Figure 5:
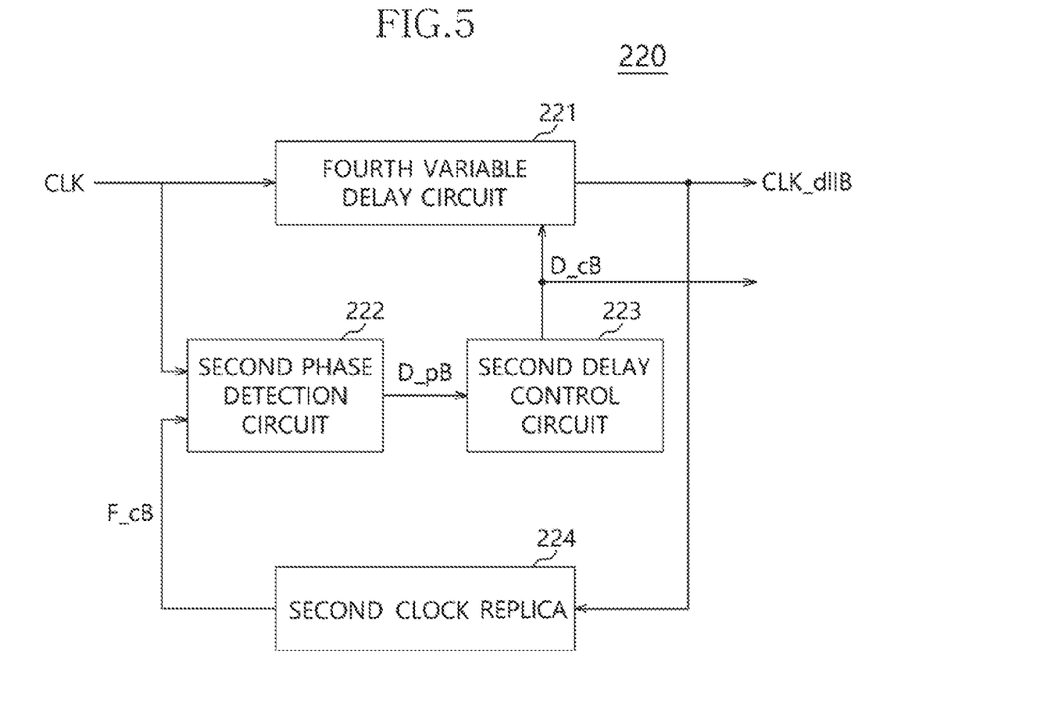
FIG. 5 is a block diagram illustrating a second DLL circuit of the semiconductor device in FIG. 1.

FIG. 5 is a block diagram illustrating a second DLL circuit of the semiconductor device in FIG. 1.

Referring to FIG. 5, the second DLL circuit 220 may include a fourth variable delay circuit 221, a second phase detection circuit 222, a second delay control circuit 223, and a second clock replica 224.

The fourth variable delay circuit 221 may delay the first clock CLK by a delay time in accordance with the second delay control signal D_cB to output the third clock CLK_dllB.

The second phase detection circuit 222 may compare phases of the first clock CLK and a second feedback clock F_cB with each other to generate a second phase detection signal D_pB.

The second delay control circuit 223 may generate the second delay control signal D_cB in response to the second phase detection signal D_pB.

The second dock replica 224 may delay the third clock CLK_dllB to output the second feedback clock F_cB. A delay time of the second clock replica 224 may correspond to the delay time of the dock path 230 in FIG. 1. The delay time of the second dock replica 224 may be substantially the same as that of the clock path 230 in FIG. 1 and that of the first clock replica 214 in FIG. 4. Thus, when the delay time of the ODT path 130 in FIG. 1 is different from the delay time of the clock path 230, the delay times of the first and second ODT replicas 114 and 124 may be different from those of the first and second clock replicas 214 and 224. For example, a replica delay time of the first DLL circuit 120 corresponding to the delay time of the second ODT replica 124 may be different from a replica delay time of the second DLL circuit 220 corresponding to the delay time of the second clock replica 224.

In accordance with examples of embodiments, the replicas such as the first ODT replica 114 and the second ODT replica 124 may each correspond to circuits which delay signals (e.g., first delay signal D_A and second clock CLK_dllA, respectively) in accordance with the delay time of the ODT path 130. The replicas such as the first clock replica 214 and the second clock replica 224 may each correspond to circuits which delay signals (e.g., third delay signal D_B and third clock CLK_dllB, respectively) in accordance with the delay time of the clock path 230.

Hereinafter, operations of the semiconductor device in accordance with examples of embodiments will be illustrated in detail.

Referring to FIGS. 1 and 3, the first dock CLK may be delayed by the delay time of the second variable delay circuit 121 to output the second clock CLK_dllA. The delay time of the second variable delay circuit 121 may be determined by the first delay control signal D_cA.

The second clock CLK_dllA may be delayed by the delay time of the second GDT replica 124 to output the first feedback clock F_cA.

The first phase detection circuit 122 may compare the phases of the first clock CLK and the first feedback clock F_cA with each other to generate the first phase detection signal D_pA. The first delay control circuit 123 may generate the first delay control signal D_cA in response to the first phase detection signal D_pA.

The first phase detection circuit 122 may output the first phase detection signal D_pA including information whether the phase of the first clock CLK is rapider than the phase of the first feedback clock F_cA or not. When the first phase detection circuit 122 detects phase of the first clock CLK rapider than the phase of the first feedback clock F_cA, the first delay control circuit 123 may generate the first delay control signal D_cA for decreasing the delay time of the second variable delay circuit 121. In contrast, when the first phase detection circuit 122 detects phase of the first clock CLK slower than the phase of the first feedback clock F_cA, the first delay control circuit 123 may generate the first delay control signal D_cA for increasing the delay time of the second variable delay circuit 121.

Therefore, the first DLL circuit 120 may determine the delay time of the second variable delay circuit 121 to provide the first clock CLK and the first feedback clock F_cA with the same phase. The first DLL circuit 120 may delay the first clock CLK by the delay time of the second variable delay circuit 121 to output the second clock CLK_dllA.

As a result, the first DLL circuit 120 may generate the second clock CLK_dllA having a phase advancing the phase of the first clock CLK by the delay time of the second ODT replica 124.

The second clock CLK_dllA and the first delay control signal D_cA may be inputted into the first internal command generation circuit 110.

Referring to FIG. 2, the first external command W/O_c may be buffered to output the first buffer signal B_A.

The first variable delay circuit 112 in which the delay time may be determined by the first delay control signal D_cA may delay the first buffer signal B_A by the determined delay time to output the first delay signal D_A.

The first ODT replica 114 may delay the first delay signal D_A by the delay time substantially the same as that of the ODT path 130 in FIG. 1 to output the second delay signal D_AA.

The first pulse generation circuit 115 may generate the first pulse P_A having an enabling section from an input point of the first buffer signal D_A to an input point of the second delay signal D_AA. The first counter 116 may perform the counting operation in accordance with the first clock CLK during the enabling section of the first pulse P_A.

The first subtraction circuit 117 may subtract the code value of the first counting code C_cA from the value of the first latency WL in the first counter 116 to generate the first subtraction signal S_A.

The first shift register 113 may delay the first delay signal D_A by the set period of the second clock CLK_dllA to output the first delay command ODT_d. The first shift register 113 may determine the set period of the second clock CLK_dllA in accordance with the first subtraction signal S_A.

That is, the first internal command generation circuit 110 in FIG. 2 may advance the phase of the first external command W/O_c by the subtraction result of the delay time of the ODT path 130 and the first latency WL to output the first delay command ODT_d. For example, the first internal command generation circuit 110 may generate the first delay command ODT_d having a phase earlier than the phase of the first external command W/O_c by a delay time corresponding to the subtraction result of the delay time of the ODT path 130 and the first latency WL.

The configuration of the first DLL circuit 120 in FIG. 3 may be substantially the same as that of the second DLL circuit 220 in FIG. 5. Thus, the second DLL circuit 220 may generate the third clock CLK_dllB having a phase advancing the phase of the first clock CLK by the delay time of the second clock replica 224. The second DLL circuit 220 may generate the second delay control signal D_cB for controlling the delay time of the fourth variable delay circuit 221 to provide the first clock CLK and the second feedback dock F_cB with the same phase.

The third dock CLK_dllB and the second delay control signal D_cB may be inputted into the second internal command generation circuit 210.

The configuration of the second internal command generation circuit 210 in FIG. 4 may be substantially the same as that of the first internal command generation circuit 110 in FIG. 2. Thus, the second internal command generation circuit 210 may advance the phase of the second external command R_c by the subtraction result of the delay time of the clock path 230 and the second latency RL to output the second delay command R_d. For example, the second internal command generation circuit 210 may generate the second delay command R_d having a phase earlier than the phase of the second external command R_c by a delay time corresponding to the subtraction result of the delay time of the clock path 230 and the second latency RL.

In examples of embodiments, the first internal command generation circuit 110 in FIG. 1 may advance the phase of the first external command W/O_c in accordance with the delay time of the ODT path 130 and the first latency WL to output the first delay command ODT_d. The second internal command generation circuit 210 may advance the phase of the second external command R_c in accordance with the delay time of the clock path 230 and the second latency RL to output the second delay command R_d.

The first delay command ODT_d may be inputted into the ODT circuit 140 through the ODT path 130. The second delay command R_d may be inputted into the data output circuit 240 through the clock path 230.

As a result, when the first external command W/O_c is inputted into the ODT circuit 140 through the ODT path 130 and the second external command R_c is inputted into the data output circuit 240 through the clock path 230, the phases of the first and second external commands W/O_c and the R_c might not be changed so that the ODT circuit 140 and the data output circuit 240 may be operated at accurate timings.

According to examples of embodiments, the DLL circuits may be individually connected with the internal circuits operated by the external commands so that the internal circuits may be operated at the accurate timings although transmission times of the external commands to the internal circuits may be different from each other.

The above described embodiments are intended to illustrate and not to limit the description. Various alternatives and equivalents are possible. The description is not limited by the embodiments described herein. Nor is the description limited to any specific type of semiconductor device. Other additions, subtractions, or modifications are obvious in view of the present disclosure and are intended to fall within the scope of the appended claims.

What is claimed is:

1. A semiconductor device comprising:
a first internal command generation circuit configured to generate a first delay command in response to a first external command, a first latency, a first clock, a first delay control signal, and a second clock;
a first delay-locked loop (DLL) circuit configured to generate the first delay control signal and the second clock in response to the first clock;
a second internal command generation circuit configured to generate a second delay command in response to a second external command, a second latency, the first clock, a second delay control signal, and a third clock; and
a second DLL circuit configured to generate the second delay control signal and the third clock in response to the first clock.

2. The semiconductor device of claim 1, wherein a replica delay time of the first DLL circuit is different from a replica delay time of the second DLL circuit.

3. The semiconductor device of claim 1, wherein the first internal command generation circuit comprises:
a buffer configured to buffer the first external command to generate a buffer signal;
a variable delay circuit configured to determine a delay time in response to the first delay control signal and configured to delay the buffer signal by the determined delay time to generate a first delay signal;
an on-die termination (ODT) replica configured to delay the first delay signal by a replica delay time of the first DLL circuit to output a second delay signal;
a pulse generation circuit configured to generate a pulse in response to the buffer signal and the second delay signal;
a counter configured to perform counting operations in response to the first clock during an enabling section of the pulse to output a counting result as a counting code;
a subtraction circuit configured to subtract a code value of the counting code from a value of the first latency to generate a subtraction signal; and
a shift register configured to determine a set period of the second clock in response to the subtraction signal and configured to delay the first delay signal by the set period of the second clock to output the first delay command.

4. The semiconductor device of claim , wherein the first DLL circuit comprises:
a variable delay circuit configured to determine a delay time in response to the first delay control signal and configured to delay the first clock by the determined delay time to output the second clock;
an on-die termination (ODT) replica configured to delay the second dock by a replica delay time of the first DLL circuit to generate a feedback clock;
a phase detection circuit configured to compare phases of the first clock and the feedback clock with each other to generate a phase detection signal; and
a delay control circuit configured to generate the first delay control signal in response to the phase detection signal.

5. The semiconductor device of claim 1, wherein the second internal command generation circuit comprises:
a buffer configured to buffer the second external command to generate a buffer signal;
a variable delay circuit configured to determine a delay time in response to the second delay control signal and configured to delay the buffer signal by the determined delay time to generate a first delay signal;
a clock replica configured to delay the first delay signal by a replica delay time of the second DLL circuit to output a second delay signal;
a pulse generation circuit configured to generate a pulse in response to the buffer signal and the second delay signal;
a counter configured to perform counting operations in response to the first clock during an enabling section of the pulse to output a counting result as a counting code;
a subtraction circuit configured to subtract a code value of the counting code from a value of the second latency to generate a subtraction signal; and
a shift register configured to determine a set period of the third dock in response to the subtraction signal and configured to delay the first delay signal by the set period of the third clock to output the second delay command.

6. The semiconductor device of claim 1, wherein the second DLL circuit comprises:
a variable delay circuit configured to determine a delay time in response to the second delay control signal and configured to delay the first clock by the determined delay time to output the third clock;
a clock replica configured to delay the third clock by a replica delay time of the second DLL circuit to generate a feedback clock;
a phase detection circuit configured to compare phases of the first clock and the feedback clock with each other to generate a phase detection signal; and
a delay control circuit configured to generate the second delay control signal in response to the phase detection signal.

7. A semiconductor device comprising:
a first internal command generation circuit configured to delay a first external command by a delay time in accordance with a first latency and a first delay control signal to output a first delay command;
a first delay-locked loop (DLL) circuit configured to generate the first delay control signal;
a second internal command generation circuit configured to delay a second external command by a delay time in accordance with a second latency and a second delay control signal to output a second delay command;
a second DLL circuit configured to generate the second delay control signal;
a first path configured to transmit the first delay command to a first internal circuit; and
a second path configured to transmit the second delay command to a second internal circuit.

8. The semiconductor device of claim 7, wherein the first internal command generation circuit and the first DLL circuit comprise replicas having a delay time substantially the same as that of the first path, respectively.

9. The semiconductor device of claim 7, wherein the second internal command generation circuit and the second DLL circuit comprise replicas having a delay time substantially the same as that of the second path, respectively.

10. The semiconductor device of claim 7, wherein the first internal command generation circuit comprises:
- a buffer configured to buffer the first external command to generate a buffer signal;
- a variable delay circuit configured to determine a delay time in response to the first delay control signal and configured to delay the buffer signal by the determined delay time to generate a first delay signal;
- an on-die termination (ODT) replica configured to delay the first delay signal by a delay time of a replica in the first DLL circuit to output a second delay signal;
- a pulse generation circuit configured to generate a pulse in response to the buffer signal and the second delay signal;
- a counter configured to perform counting operations in response to a clock during an enabling section of the pulse to output a counting result as a counting code;
- a subtraction circuit configured to subtract a code value of the counting code from a value of the first latency to generate a subtraction signal; and
- a shift register configured to delay the first delay signal by a delay time in accordance with the subtraction signal to output the first delay command.

11. The semiconductor device of claim 10,
wherein the pulse generation circuit enables the pulse when the buffer signal is inputted into the pulse generation circuit, and
wherein the pulse generation circuit disables the pulse when the second delay signal is inputted into the pulse generation circuit.

12. The semiconductor device of claim 7, wherein the second internal command generation circuit comprises:
- a buffer configured to buffer the second external command to generate a buffer signal;
- a variable delay circuit configured to determine a delay time in response to the second delay control signal and configured to delay the buffer signal by the determined delay time to generate a first delay signal;
- a clock replica configured to delay the first delay signal by a delay time of a replica in the second DLL circuit to output a second delay signal;
- a pulse generation circuit configured to generate a pulse in response to the buffer signal and the second delay signal;
- a counter configured to perform counting operations in response to a clock during an enabling section of the pulse to output a counting result as a counting code;
- a subtraction circuit configured to subtract a code value of the counting code from a value of the second latency to generate a subtraction signal; and
- a shift register configured to delay the first delay signal by a delay time in accordance with the subtraction signal to output the second delay command.

13. The semiconductor device of claim 12,
wherein the pulse generation circuit enables the pulse when the buffer signal is inputted into the pulse generation circuit, and
wherein the pulse generation circuit disables the pulse when the second delay signal is inputted into the pulse generation circuit.

14. The semiconductor device of claim 7,
wherein the first internal circuit and the second internal circuit to are connected to the same pad configured to provide external connectivity.

15. The semiconductor device of claim 7,
wherein the first external command corresponds to a write is command or an on-die termination (ODT) command, and
wherein the second external command corresponds to a read command.

16. The semiconductor device of claim 7, wherein the first delay command having a phase advancing a phase of the first external command by a subtraction result of a delay time of the first path and the first latency.

17. The semiconductor device of claim 7, wherein the second delay command having a phase advancing a phase of the second external command by a subtraction result of a delay time of the second path and the second latency.

* * * * *

UNITED STATES PATENT AND TRADEMARK OFFICE
CERTIFICATE OF CORRECTION

PATENT NO. : 10,665,276 B2  
APPLICATION NO. : 16/220283  
DATED : May 26, 2020  
INVENTOR(S) : Gyu Tae Park and Young Suk Seo

Page 1 of 1

It is certified that error appears in the above-identified patent and that said Letters Patent is hereby corrected as shown below:

In the Claims

Claim 4 in Column 9, Line 56 should read:
4. The semiconductor device of claim 1, wherein the first DLL circuit comprises:
a variable delay circuit configured to determine a delay time in response to the first delay control signal and configured to delay the
    first clock by the determined delay time to output the second clock;
an on-die termination (ODT) replica configured to delay the second clock by a replica delay time of the first DLL circuit to generate a feedback clock;
a phase detection circuit configured to compare phases of the
    first clock and the feedback clock with each other to generate a phase
detection signal; and
a delay control circuit configured to generate the first delay control signal in response to the phase detection signal.

Signed and Sealed this  
Eighteenth Day of August, 2020

Andrei Iancu  
*Director of the United States Patent and Trademark Office*